United States Patent [19]

Yumoto et al.

[11] Patent Number: 5,110,706
[45] Date of Patent: May 5, 1992

[54] I-LINE RADIATION-SENSITIVE ALKALI-SOLUBLE RESIN COMPOSITION UTILIZING 1,2-QUINONE DIAZIDE COMPOUND AND HYDROXY-CHALCONE ADDITIVE

[75] Inventors: Yoshiji Yumoto; Tsutomu Shimokawa; Takao Miura, all of Yokkaichi, Japan

[73] Assignee: Japan Synthetic Rubber Co., Ltd., Tokyo, Japan

[21] Appl. No.: 611,762

[22] Filed: Nov. 13, 1990

[30] Foreign Application Priority Data

Nov. 14, 1989 [JP] Japan .................................. 1-295416

[51] Int. Cl.$^5$ .......................... G03F 7/023; G03C 1/61
[52] U.S. Cl. .................................... 430/191; 430/165; 430/190; 430/192; 430/193; 430/512
[58] Field of Search ............... 430/191, 512, 923, 190, 430/192

[56] References Cited

U.S. PATENT DOCUMENTS 3,595,656 7/1971 Ruckert et al. ..................... 430/196

FOREIGN PATENT DOCUMENTS 0231522 8/1987 European Pat. Off. .

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

A radiation-sensitive resin composition comprises (a) an alkali-soluble resin, (b) a 1,2-quinone diazide compound, and (c) an aromatic compound having a specified molecular structure, as essential constituents. The composition is extremely useful for forming a positive type photoresist on a substrate having a high reflectance.

4 Claims, No Drawings

I-LINE RADIATION-SENSITIVE ALKALI-SOLUBLE RESIN COMPOSITION UTILIZING 1,2-QUINONE DIAZIDE COMPOUND AND HYDROXY-CHALCONE ADDITIVE

BACKGROUND OF THE INVENTION

1. Field of the Invention

This invention relates to a radiation-sensitive resin composition, and more particularly to a radiation-sensitive resin composition suitable for forming a positive type photoresist layer on a substrate having a high reflectance.

2. Description of the Prior Art

In the production of integrated circuits of high integration degrees, there have been used positive type photoresists comprising a quinone diazide compound and a novolak resin. When the positive type photoresists are applied to substrates having a high reflectance, for instance, substrates of aluminum, an aluminum alloy such as aluminum-silicon, aluminum-silicon-copper, etc., or of polysilicon, halation would occur upon irradiation with radiations. That is, upon irradiation with radiations, the light is reflected to the areas which are not to be irradiated and, as a result, it is impossible to reproduce accurately a fine photoresist pattern. In order to overcome this problem, there has been used a method of adding a radiation-absorbing material to the positive type photoresist so as to reduce the radiation transmittance of the photoresist, thereby suppressing the reflection of the radiations on the substrate at the time of irradiation.

Such an approach, however, would lead to the following problems. At the time of prebaking, which is carried out after application of the positive type photoresist to the substrate for the purpose of removing the residual solvent and thereby enhancing the adhesion between the positive type photoresist and the substrate, part of the radiation-absorbing material is sublimed from the inside of the photoresist film. The sublimation of the radiation-absorbing material may cause a considerable lowering in the antihalation effect, or may worsen the preservation stability of the positive type photoresist. Consequently, the performance of the photoresist may vary with time, or the developing property of the photoresist may be lowered, resulting in a lower resolution.

SUMMARY OF THE INVENTION

It is accordingly an object of this invention to overcome the aforementioned problems involved in adding the radiation-absorbing material to the positive type photoresist, and to provide a radiation-sensitive resin composition which is excellent in resolution, sensitivity, developing properties, heat resistance and an antihalation effect, is free of lowering in photoresist performance under any prebaking conditions, is high in preservation stability, and is suitable for use as a positive type photoresist with a high remained thickness ratio upon development.

The composition according to this invention comprises, as essential constituents, the following three components (a) to (c):

(a) An alkali-soluble resin.

(b) A 1,2-quinone diazide compound, which may have reacted with the alkali-soluble resin to form a condensate.

(c) A compound represented by the following structural formula [I]:

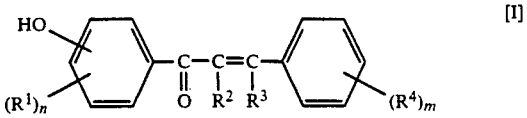

wherein $R^1$ and $R^4$, which may be identical or different, each represent a hydrogen atom; an alkyl group of preferably from 1 to 10 carbon atoms, such as methyl, ethyl, etc.; an alkoxy group of preferably from 1 to 10 carbon atoms, such as methoxy, ethoxy, etc.; an alkenyl group of preferably from 3 to 10 carbon atoms, such as allyl, isopropenyl, etc.; an aralkyl group of preferably from 7 to 12 carbon atoms, such as benzyl, etc.; a cyclicalkoxy group of preferably from 4 to 6 carbon atoms, such as dioxolenyl, etc.; an amino group; an amido group; a nitro group; a cyano group; or a halogen atom, such as chlorine, bromine, etc.;

$R^2$ and $R^3$, which may be identical or different, each represent a hydrogen atom; an alkyl group of preferably 1 to 10 carbon atoms, such as methyl, ethyl, etc.; an alkoxy group of preferably from 1 to 10 carbon atoms, such as methoxy, ethoxy, etc.; an amino group; an amido group; a cyano group; or a halogen atom, such as chlorine, bromine, etc.; and n and m each represent an integer of from 1 to 4 (the compound of the formula [I] is hereinafter referred to as "the specified aromatic compound").

The radiation-sensitive resin composition of this invention is excellent in resolution, sensitivity, developing properties, heat resistance and an antihalation effect, is free of lowering in photoresist performance under any prebaking conditions, and is excellent in preservation stability.

Furthermore, the composition of this invention is extremely useful as a positive type photoresist which is sensitive to ultraviolet radiations, such as i-line, g-line, etc., deep ultraviolet radiations, or excimer laser of KrF, ArF or the like, and is high in remained thickness ratio upon development.

DETAILED DESCRIPTION OF THE INVENTION

The above constituents will now be explained in detail below.

(a) Alkali-soluble resin

As the alkali-soluble resin in this invention, for instance, alkali-soluble novolak resins (hereinafter referred to simply as "novolak resins") can be used preferably. The novolak resins can be obtained by polycondensation of phenols with aldehydes in the presence of an acid catalyst.

The phenols usable for preparing the novolak resins include, for example, phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-tbutylphenol, 2-methylresorcinol, 4-methylresorcinol, 5-methylresorcinol, 4-t-butylcatechol, 2-methoxyphenol, 3-methoxyphenol, 4-methoxyphenol, 2-methoxycatechol, 2-methoxyresorcinol, 3-methoxyresorcinol, 2,3-dimethoxyphenol, 2,5-dimethoxyphenol, 3,5-dimethoxyphenol, methyl gallate, ethyl gallate, methyl 3- methoxy-4,5-dihydroxybenzoate, ethyl 3-methoxy-4,5-dihydroxybenzoate, methyl 4-methoxy-4,5-dihydroxybenzoate, ethyl 4-methoxy-4,5-dihydroxybenzoate, methyl 3,4-dimethoxy-5-hydroxybenzoate. ethyl 3,4-dimethoxy-5-hydroxybenzoate, methyl 3,5-dimethoxy-4-hydroxybenzoate, ethyl 3,5-dimethoxy-4-hydroxybenzoate, 2-ethylphenol, 3-ethylphenol, 4-ethylphenol, 2,3,5-triethylphenol, 3,4,5-triethylphenol, 2,3-diethylphenol, 2,5-diethylphenol, 3,4-diethylphenol, 3,5-diethylphenol, 2,4-diethylphenol, 2,6-diethylphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, thymol, isothymol, etc.

Among the above phenols, preferred are o-cresol, m-cresol, p-cresol, 2,3-dimethylphenol, 2,5-dimethylphenol, 3,4-dimethylphenol, 3,5-dimethylphenol, 2,3,5-trimethylphenol, 3,4,5-trimethylphenol, etc. At least one of these compounds may be used either singly or in combination.

The aldehydes usable for polycondensation with the phenols include, for example, formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, etc. Among these aldehydes, preferred are formaldehyde, acetaldehyde and benzaldehyde. At least one of these aldehydes may be used either singly or in combination.

The aldehydes are used preferably in an amount of from 0.7 to 3 moles, more preferably from 0.75 to 1.3 moles, per mole of the phenols.

The acid catalysts which can be used for the polycondensation include, for example, inorganic acids such as hydrochloric acid, nitric acid, sulfuric acid, etc., and organic acids such as formic acid, oxalic acid, acetic acid, etc. The amount of the acid catalysts used is ordinarily from $1 \times 10^{-5}$ to $5 \times 10^{-1}$ mole per mole of the phenols.

In the polycondensation, generally, water is used as a reaction medium. However, where the phenol used for the polycondensation is insoluble in the aqueous solution of the aldehyde and therefore the reactants form a heterogeneous system from the beginning of the reaction, a hydrophilic solvent may also be used as the reaction medium. The hydrophilic solvents usable in such a case include, for example, alcohols such as methanol, ethanol, propanol, butanol, etc., and cyclic ethers such as tetrahydrofuran, dioxane, etc. The amount of the reaction medium is ordinarily from 20 to 1000 parts by weight per 100 parts by weight of the reactants.

The polycondensation temperature can be controlled appropriately according to the reactivity of the reactants, and is generally from 20 to 200° C., preferably from 70° to 150° C.

The polycondensation may be carried out by, for example, a method in which the phenol, aldehyde, acid catalyst and the like are placed in a reaction vessel on a batch basis, or a method in which the phenol, aldehyde and the like are added gradually as the reaction proceeds.

After the polycondensation is finished, the temperature inside the reaction vessel is generally raised to a temperature of from 130 to 230° C, in order to remove the unreacted reactants, the acid catalyst and the reaction medium from the reaction system. Then, volatile components are distilled off under a reduced pressure, for instance from 20 to 50 mmHg, and the novolak resin formed is recovered. Alternatively, the reaction mixture after the polycondensation may be dissolved in the aforementioned hydrophilic solvent and a precipitant such as water, n-hexane, n-heptane, etc., may be added to the resultant solution to precipitate the novolak resin, thereby separating and collecting the novolak resin.

The weight average molecular weight, in terms as polystyrene, of the novolak resin used in this invention is generally from 2000 to 25000, preferably from 3500 to 20000. If the average molecular weight is less than 3500, the shape of photoresist pattern as well as resolution and developing properties are poor. If the average molecular weight exceeds 20000, on the other hand, the shape of the pattern and the developing properties are degraded; especially, sensitivity is lowered.

In this invention, other alkali-soluble resins than the novolak resins can also be used. The other alkali-soluble resins usable include, for example, polyhydroxystyrene or derivatives thereof, styrene-maleic anhydride copolymers, polyvinyl hydroxybenzoate, carboxyl-containing methacrylic resins, etc.

(b) 1,2-Quinone diazide compound

The 1,2-quinone diazide compounds for use in this invention include, for example, 1,2-benzoquinonediazide-4-sulfonates, 1,2-naphthoquinonediazide-4-sulfonates, 1,2- naphthoquinonediazide-5-sulfonates, etc. More specific examples of the usable 1,2-quinone diazide compounds are 1,2-benzoquinonediazide-4-sulfonates, 1,2-naphthoquinonediazide-4-sulfonates or 1,2-naphthoquinonediazide-5-sulfonates of (poly)hydroxybenzenes such as p-cresol, resorcinol, pyrogallol, phloroglucinol, etc.; 1,2-benzoquinonediazide-4-sulfonates, 1,2-naphthoquinonediazide-4-sulfonates or 1,2-naphthoquinonediazide-5-sulfonates of (poly)hydroxyphenyl alkyl ketones or (poly)hydroxyphenyl aryl ketones such as 2,4-dihydroxyphenyl propyl ketone, 2,4-dihydroxyphenyl n-hexyl ketone, 2,4-dihydroxybenzophenone, 2,3,4-trihydroxyphenyl n-hexyl ketone, 2,3,4-trihydroxybenzophenone, 2,4,6-trihydroxybenzophenone, 2,3,4,4'-tetrahydroxybenzophenone, 2,3,4,3'-tetrahydroxybenzophenone, 2,3,4,2'-tetrahydroxy-4'-methylbenzophenone, 2,3,4,4'-tetrahydroxy-3'methoxybenzophenone, 2,2'4,4'-tetrahydroxybenzophenone, 2,2'3,4,6'-pentahydroxybenzophenone, 2,3,3'4,4',5'-hexahydroxybenzophenone, 2,3',4,4',5',6-hexahydroxybenzophenone, etc.; 1,2-benzoquinonediazide-4sulfonates, 1,2-naphthoquinonediazide-4-sulfonates or 1,2-naphthoquinonediazide-5-sulfonates of bis[(poly)hydroxyphenyl]alkanes such as bis(p-hydroxyphenyl)methane, bis(2,4-dihydroxyphenyl)methane, bis(2,3,4-dihydroxyphenyl)methane, 2,2-bis(p-hydroxyphenyl)propane, 2,2-bis(2,3,4-dihydroxyphenyl)propane, etc.; 1,2-benzoquinonediazide-4-sulfonates, 1,2-naphthoquinonediazide-4-sulfonates or 1,2-naphthoquinonediazide-5-sulfonates of alkyl (poly)hydroxybenzoates or aryl (poly)hydroxybenzoates such as lauryl 3,5-dihydroxybenzoate, phenyl 2,3,4-trihydroxybenzoate, lauryl 3,4,5-trihydroxybenzoate, propyl 3,4,5-trihydroxybenzoate, phenyl 3,4,5-trihydroxybenzoate, etc.; 1,2-benzoquinonediazide-4-sulfonates, 1,2-naphthoquinonediazide-4-sulfonates or 1,2-naphthoquinonediazide-5-sulfonates of bis(polyhydroxybenzoyl)methanes such as bis(2,5-dihydroxybenzoyl)methane, bis(2,3,4-trihydroxybenzoyl)methane and bis(2,4,6-trihydroxybenzoyl)methane, or bis(polyhydroxybenzoyl)benzenes such as p-bis(2,5-dihydroxybenzoyl)benzene, p-bis(2,3,4-trihydroxybenzoyl)benzene, and p-bis(2,4,6-trihydroxybenzoyl)benzene; and 1,2-benzoquinonediazide-4-sulfonates, 1,2-naphthoquinonediazide-4-sulfonates or 1,2-naphthoquinonediazide-5-sulfonates of polyethylene glycol di[(poly)hydroxybenzoates] such as ethylene glycol di(3,5-dihydroxybenzoate), polyethylene glycol di(3,4,5-trihydroxybenzoate), etc. Other than the above compounds, the 1,2-quinone diazide compounds described in J. Kosar, "Light-Sensitive Systems" 339–352, (1965), John Wiley & Sons (New York) and those described in W. S. De Forest, "Photoresist" 50, (1975), McGraw-Hill, Inc., (New York) can also be used. At least one of these 1,2-quinone diazide compounds may be used either singly or in combination. Part or the whole of the 1,2-quinone diazide compound used may have reacted with the alkali-soluble resin of component (a) to form a condensate.

The amount of the 1,2-quinone diazide compound to be used is generally from 5 to 100 parts by weight, preferably from 10 to 50 parts by weight, per 100 parts by weight of the alkali-soluble resin of component (a). If the amount of the 1,2-quinone diazide compound is less than 5 parts by weight, the amount of the carboxylic acid which the 1,2-quinone diazide compound forms through absorbing the radiations is so small that the patterning of the photoresist is difficult to achieve. If the amount of the 1,2-quinone diazide compound is more than 100 parts by weight, on the other hand, it is impossible to decompose the 1,2-quinone diazide compound completely by short-time irradiation with radiations and, therefore, it may be difficult to develop the photoresist pattern by a developing solution comprising an aqueous alkaline solution.

(c) Specified aromatic compound

The specified aromatic compound represented by the aforementioned structural formula [I] used in this invention acts as a radiation-absorbing agent. Examples of the specified aromatic compound include 4-hydroxy-4'-methoxychalcone, 4-hydroxy-4'-methylchalcone, 4-hydroxy-3',4'-dimethylchalcone, 4-hydroxy-3'-methoxy-4'-methylchalcone, 4-hydroxy-4'-ethylchalcone, 4-hydroxy-4'-isopropylchalcone, 4-hydroxy-3',4'-dimethoxychalcone, 4-hydroxy-4'-methoxy-α-cyanochalcone, 4-hydroxy-3',4',5'-trimethoxychalcone, 4-hydroxy-4'-nitrochalcone, 4-hydroxy-4'-nitro-3'-chlorochalcone, 4-hydroxy-α-chloro-4'-aminochalcone, 4-hydroxy-α-cyano-β-allyl-4',3'-dimethoxychalcone, 4-hydroxy-α-isopropenyl-3',4',5'-trimethoxychalcone, 4-hydroxy-2'-nitro-3'-benzyl-4'-methoxychalcone, 4-hydroxy-2'-nitrochalcone, 4-hydroxy-3-methyl-4'-nitrochalcone, 2-hydroxy-4-methoxy-4'-cyanochalcone, 4-hydroxy-3',4'-dioxolenylchalcone, 4-hydroxy-α-cyano-4'-aminochalcone, 4-hydroxy-α-cyano-4'-(N,N-dimethylamino)chalcone, 4-hydroxy-α-cyano-4'-morpholinochalcone, 4-hydroxy-3'-methyl-4'-methoxychalcone, 4-hydroxy-α-cyano-3'-methyl-4'-methoxychalcone, 4-hydroxy-3-nitro-3',4'-dimethoxychalcone, 3-methoxy-4-hydroxy-α-cyano-4'-aminochalcone, etc. Among the above specified aromatic compounds preferred are 4-hydroxy-4'-methylchalcone, 4-hydroxy-3',4'-dimethoxychalcone, 4-hydroxy-3',4',5'-trimethoxychalcone, 4-hydroxy-3',4'-dioxolenylchalcone, and 4-hydroxy-3',4'-dimethylchalcone. At least one of these compounds may be used either singly or in combination.

The amount of the specified aromatic compound is preferably from 0.1 to 10 parts by weight, more preferably from 1 to 5 parts by weight, per 100 parts by weight of the alkali-soluble resin of component (a). If the amount of the specified aromatic compound is too large, sensitivity of the resultant composition is lowered, whereas if the amount is too small, the compound may fail to exhibit the antihalation effect.

In this invention, in addition to the specified aromatic compound of component (c), one or more radiation-absorbing compounds may also be used, in an amount of up to 5 parts by weight per 100 parts by weight of the alkali-soluble resin of component (a). The radiation-absorbing compounds usable include, for example, 1,7-bis(4-hydroxyphenyl)-1,6-heptadiene-3,5-dione, 1-(4-hydroxyphenyl)-7-(3-methoxy-4-hydroxyphenyl)-1,6-heptadiene-3,5-dione, 1,7-bis(3-methoxy-4-hydroxyphenyl)-1,6-heptadiene-3,5-dione, 1,7-bis(2,4-dihydroxyphenyl)-1,6-heptadiene-3,5-dione, 1,7-bis(2,3,4-trihydroxyphenyl)-1,6-heptadiene-3,5-dione, 1-(4-hydroxyphenyl)-7-(2,3,4-trihydroxyphenyl)-1,6-heptadiene-3,5-dione, 1,7-bis(3-methoxy-4-hydroxyphenyl)-4,4-dimethyl-1,6-heptadiene-3,5-dione, 1,7-bis(3-methoxy-4-hydroxyphenyl)-4,4-diethyl-1,6-heptadiene-3,5-dione, 1,7-bis(3-methoxy-4-hydroxyphenyl)-4,4-diethyl-1,6-heptadiene-3,5-dione, 1,7-bis(3-methoxy-4-hydroxyphenyl)-1,2,6,7-tetramethyl-1,6-heptadiene-3,5dione, 1,7-bis(3-methoxy-4-hydroxyphenyl)-1,2,4,4',6,7-hexamethyl-1,6-heptadiene-3,5-dione, 1,7-bis(3-ethoxy-4-hydroxyphenyl)-1,6-heptadiene-3,5-dione, 1,7-bis(3-butoxy-4-hydroxyphenyl)-1,6-heptadiene-3,5-dione, 1-(3-methyl-4-hydroxyphenyl)-7-(3-methoxy-4-hydroxyphenyl)-1,6-heptadiene-3,5-dione, 1-(3,5-dimethyl-4-hydroxyphenyl)-7-(3-methoxy-4-hydroxyphenyl)-1,6-heptadiene-3,5-dione, 1,7-bis(3-methyl-4-hydroxyphenyl)-1,6-heptadiene-3,5-dione, and oil-soluble dyes, disperse dyes and basic dyes such as Methyl Violet 2B (CI No. 42555), Malachite Green (CI No. 42000), Victoria Blue B (CI No. 44045), Neutral Red (CI No. 50040), Solvent Yellow 2 (CI No. 11020), Solvent Yellow 6 (CI No. 11390), Solvent Yellow 14 (CI No. 12055), Solvent Yellow 15 (CI No. 18820), Solvent Yellow 16 (CI No. 12700), Solvent Yellow 21 (CI No. 18690), Solvent Yellow D-33 (CI No. 47000), Solvent Yellow 56 (CI No. 11021), Solvent Orange 1 (CI No. 11920), Solvent Orange 2 (CI No. 12100), Solvent Orange 14 (CI No. 26020), Solvent Orange 40, Solvent Red 3 (CI No. 12010), Solvent Red 8 (CI No. 12715), Solvent Red 23 (CI No. 26100), Solvent Red 24 (CI No. 26105), Solvent Red 25 (CI No. 16110), Solvent Red 27 (CI No. 26125), Solvent Red (CI No. 45170B), Disperse Red 9 (CI No. 60505), Oil Scarlet 308 (CI No. 21260), Solvent Brown (CI No. 12020), Disperse Yellow 1 (CI No.10345), Disperse Yellow 3 (CI No. 11855), Disperse Yellow 4 (CI No. 12770), Disperse Yellow 8 (CI No. 27090), Disperse Yellow 42 (CI No. 10338), Disperse Orange 1 (CI No. 11080), Disperse Orange 3 (CI No. 11005), Disperse Orange 5 (CI No. 11100), Disperse Orange 11 (CI No. 60700), Disperse Red 1 (CI No. 11110), Disperse Red 4 (CI No. 60755), Disperse Red 11 (CI No. 62015), Disperse Red 15 (CI No. 60710), Disperse Red 58 (CI No. 11135), etc.; methine dyes such as Miketon Fast Yellow 7G, Miketon Fast Orange 5R (products by Mitsui Toatsu Dyes, Ltd.), Foron (produced by Sandoz K.K.), Macrolex Yellow 6G (produced by Bayer (Japan) Ltd.), etc.; pyrazole or imidazole dyes such as Yellow HM-1123, Yellow HM-1134 (products by Mitsui Toatsu Dyes, Ltd.), 5-methyl-1-phenyl-4-phenylazopyrazole, 1-phenyl-4-phenylazo-5-oxypyrazole, 1-phenyl-4-phenylazo-5-methylimidazole, 1-phenyl-4-phenylazo-5-oxyimidazole, etc.; fluorescent brighteners such as stilbene, 4,4-diaminostilbenesulfonic acid derivatives, coumarin derivatives, pyrazoline derivatives, etc.; hydroxyazo dyes, etc.

Other compounding agents

The composition of this invention may further incorporate a sensitizer, primarily for attaining a higher sensitivity. The sensitizers which can be incorporated include, for example, 2H-pyrido-(3,2-b)-1,4-oxazin-3(4H)-ones, 10H-pyrido-(3,2-b)-(1,4)-benzothiazines, urazols, hydantoins, barubituric acids, glycine anhydrides, 1-hydroxybenzotriazoles, alloxans, maleimides, etc. The amount of the sensitizer is generally 100 parts by weight or below, preferably from 4 to 60 parts by weight, per 100 parts by weight of the 1,2-quinone diazide compound.

Also, a surface active agent may be incorporated into the composition of this invention, in order to improve the application properties or developing properties of the composition. The surface active agent usable include, for example, polyoxyethylene alkyl ethers such as polyoxyethylene lauryl ether, polyoxyethylene stearyl ether, polyoxyethylene oleyl ether, etc.; polyoxyethylene aryl ethers such as polyoxyethylene octylphenyl ether, polyoxyethylene nonyphenyl ether, etc.; polyethylene glycol dialkyl esters such as polyethylene glycol dilaurate, polyethylene glycol distearate, etc.; fluoro surface active agents such as F-Top EF301, EF303 and EF352 (products by Shin-Akita Kasei K.K.), Megafac F171, F172 and F173 (products by Dainippon Ink & Chemicals, Inc.), Fluorad FC430 and FC431 (products by Sumitomo 3M Co., Ltd.), Asahi Guard AG710, Surflon S-382, SC-101, SC-102, SC-103, SC-104, SC-105 and SC-106 (products by Asahi Glass Co., Ltd.), etc.; organosiloxane polymer KP341 (a product by The Shin-Etsu Chemical Co., Ltd.); acrylic or methacrylic (co)polymers Polyflow No. 75 and No. 95 (products by Kyoeisha Chemical Co., Ltd.), etc. The amount of the surfactant is generally 2 parts by weight or below, preferably 1 part by weight or below, per 100 parts by weight of solid components in the composition.

Preparation of the composition of the Invention

The composition of this invention is prepared by dissolving predetermined amounts of the alkali-soluble resin of component (a), the 1,2-quinone diazide compound of component (b), the specified aromatic compound of component (c) and other compounding agents in a solvent, in such a manner as to obtain, for instance, a solids concentration of from 20 to 40% by weight, and filtering the resultant solution through a filter of a pore diameter of about 0.1 μm.

Examples of the solvent to be used here include glycol ethers such as ethylene glycol monomethyl ether, ethylene glycol monoethyl ether, etc.; ethylene glycol alkyl ether acetates such as methyl cellosolve acetate, ethyl cellosolve acetate, etc.; diethylene glycols such as diethylene glycol monoethyl ether, etc.; propylene glycol alkyl ether acetates such as propylene glycol methyl ether acetate, propylene glycol ethyl ether acetate, propylene glycol propyl ether acetate, etc.; aromatic hydrocarbons such as toluene, xylene, etc.; and esters such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methyl-3-methoxybutyl acetate, 3-methyl-3-methoxybutyl propionate, 3-methyl-3-methoxybutyl butyrate, ethyl acetate, butyl acetate, etc. At least one of these solvents may be used either singly or in combination. Furthermore, high boiling point solvents such as benzyl ethyl ether, dihexyl ether, diethylene glycol monomethyl ether, diethylene glycol monoethyl ether, diethylene glycol monobutyl ether, acetonitrile acetone, isophorone, caproic acid, caprylic acid, 1-octanol, 1-nonanol, benzyl alcohol, benzyl acetate, ethyl benzoate, diethyl oxalate, diethyl maleate, gamma-butyrolactone, ethylene carbonate, propylene carbonate, phenyl cellosolve acetate, etc., can also be added.

Developing solution

As the developing solution for the composition of this invention, aqueous alkaline solutions are used, for example, aqueous solutions of organic alkalis such as sodium hydroxide, potassium hydroxide, sodium carbonate, sodium silicate, sodium metasilicate, aqueous ammonia, etc.; primary amines such as ethylamine, n-propylamine, etc.; secondary amines such as diethylamine, di-n-propylamine, etc.; tertiary amines such as triethylamine, methyldiethylamine, etc.; alcohol amines such as dimethylethanolamine, triethanolamine, etc.; quaternary ammonium salts such as tetramethylammonium hydroxide, tetraethylammonium hydroxide, choline, etc.; cyclic amines such as pyrrole, piperidine, 1,8-diazabicyclo-(5,4,0)-7-undecene, 1,5-diazabicyclo-(4,3,0)-5-nonane, etc. Furthermore, water-soluble organic solvents, for example, alcohols such as methanol, ethanol, etc., or surface active agents may also be added to the developing solution in appropriate amounts.

EXAMPLES

This invention will now be explained more in detail referring to the following examples, which are not to be constructed as limitative of the invention.

EXAMPLE 1

(1) A flask equipped with an agitator, a cooling pipe and a thermometer was charged with 324 g (3 mol) of m-cresol, 244 g (2 mol) of 3,5-dimethylphenol, 770 g of a 37 wt. % aqueous solution of formaldehyde and 0.8 g of oxalic acid. The flask was immersed in an oil bath, and the temperature inside the flask was maintained at 100° C. to cause a reaction for 1 hour (initial reaction). Then, 324 g (3 mol) of m-cresol and 244 g (2 mol) of 3,5-dimethylphenol were further added to the flask, continuously as the reaction was permitted to proceed for another 2 hours.

Next, the oil bath temperature was raised to 180° C., and the pressure inside the flask was simultaneously reduced to remove the unreacted formaldehyde, m-cresol and 3,5-dimethylphenol, as well as oxalic acid. The novolak resin formed, in a molten state, was then recovered by cooling back to room temperature.

The novolak resin thus obtained, together with the 1,2-quinone diazide compound and the specified aromatic compound of the kinds and in the amounts as set forth in Table 1 below, was dissolved in ethyl cellosolve acetate used in the amount shown in Table 1. The resulting solution was filtered through a filter with 0.1 μm pore diameter to prepare a solution of a composition according to this invention.

(2) The solution obtained in (1) above was applied to a silicon wafer, which had a 0.2 μm thick aluminum layer vapor-deposited thereon and had a 0.6 μm stepped structure, by spin coating. The solution thus applied was prebaked for 2 minutes on a hot plate maintained at 90° C., to form a photoresist film with a dry film thickness of 1.8 μm.

The photoresist film was irradiated with ultraviolet radiations (i-line) by a 1/5 reduction projection aligner (produced by Nikon Corp. and sold under the product code NSR1505i6A) having a 1000 W super-high pressure mercury vapor lamp, through a reticle having a test pattern with the line width equal to the space width (1/1S pattern). After the irradiation, the photoresist pattern was developed by immersing the photoresist film in a developing solution comprising a 2.4 wt.% aqueous solution of tetramethylammonium hydroxide at 25° C. for 1 minute, followed by rinsing in water and drying.

Upon observation of the photoresist pattern thus obtained under a scanning electron microscope, it was found that the sensitivity, namely, the irradiation time necessary for 1:1 separation of the 0.6-μm 1L/1S pattern was 0.40 seconds, and the remained thickness ratio upon development for that irradiation time was 98%. Thus, the developed properties of the photoresist were good, and insufficient development was not observed. Furthermore, there was no line breakage or dropout caused under the influence of halation, and it was possible to develop accurately the photoresist patterns ranging to a 0.50-μm photoresist pattern.

Wafers provided thereon with photoresist patterns were heated on a hot plate for 2 minutes to determine the temperature at which a 20-μm pattern started being deformed. The temperature thus determined was 130° C., indicating the good heat resistance of the photoresist. The results are set forth collectively in Table 1.

(3) The solution obtained in (1) above was preserved at 25° C. for 3 months. Then, the solution was evaluated in the same manner as in (2), to yield a photoresist performance equivalent to the above. Thus, it was found that the composition of this invention is excellent in preservation stability, also.

(4) The solution obtained in (1) above was applied to a silicon wafer by spin coating and prebaked in the same manner as in (2), and was left to stand at 25° C for 4 days. The film thus treated was evaluated by exposure in the same manner as in (2), to give a photoresist performance equivalent to that obtained in (2). This result shows that the composition of the invention is also excellent in stability after application.

EXAMPLE 2

(1) A solution of a composition of this invention was prepared in the same manner as in Example 1 (1) except that the novolak resin obtained in Example 1 (1), together with the 1,2-quinone diazide compound and the specified aromatic compound of the kinds and in the amounts as set forth in Table 1, was dissolved in ethyl cellosolve acetate used in the amount shown in Table 1.

(2) The solution thus obtained in (1) was subjected to evaluation in the same manner as in Example 1 (2) The results are shown in Table 1.

(3) Upon evaluation in the same manner as in Example 1 (3) and (4), the solution obtained in (1) above was found to be excellent in preservation stability and in stability after application.

EXAMPLES 3 to 20

Solutions of compositions according to this invention were prepared in the same manner as in Example 1 (1) except that the novolak resins, 1,2-quinone diazide compounds and specific aromatic compounds of the kinds and in the amounts as set forth in Table 1 were dissolved in ethyl cellosolve acetate used in the amounts shown in Table 1.

Each of the novolak resins shown in Table 1 was synthesized in the same manner as in Example 1 (1) except that one-half of the "charge composition of phenols" shown in Table 1 was fed into a flask at the beginning of the synthesis, and, after completion of the initial reaction, the remaining half was fed continuously into the flask as the reaction proceeded.

(2) The solutions thus obtained in (1) were evaluated in the same manner as in Example 1 (2). The results are shown in Table 1.

(3) Upon evaluation in the same manner as in Example 1 (3), the solutions obtained in (1) were found to be excellent in preservation stability.

TABLE 1

| Exp. | Novolak resin Charge composition of phenols (mol %) | Amount (parts by wt.) | 1,2-Quinone diazide compound 1) Kind | Amount (parts by wt.) | Specified aromatic compound 2) Kind | Amount (parts by wt.) | Ethyl cellosolve acetate Amount (parts by wt.) | Sensitivity | Resolution (μm) | Developing properties | Heat resistance (°C.) | Remained thickness ratio (%) |
|---|---|---|---|---|---|---|---|---|---|---|---|---|
| 1 | m-cresol/3,5-dimethylphenol = 60/40 | 100 | I | 29 | A | 3 | 320 | 0.40 | 0.50 | Good | 130 | 98 |
| 2 | m-cresol/3,5-dimethylphenol = 60/40 | 100 | I | 29 | B | 3 | 320 | 0.52 | 0.50 | Good | 130 | 97 |
| 3 | m-cresol/3,5-dimethylphenol = 60/40 | 100 | I | 29 | C | 3 | 320 | 0.45 | 0.50 | Good | 130 | 97 |
| 4 | m-cresol/3,5-dimethylphenol = 50/50 | 100 | I | 26 | B | 3 | 310 | 0.55 | 0.50 | Good | 125 | 98 |
| 5 | m-cresol/2,3,5-trimethylphenol = 60/40 | 100 | I | 29 | C | 3 | 316 | 0.48 | 0.50 | Good | 125 | 99 |
| 6 | m-cresol/p-cresol = 40/60 | 100 | II | 26 | A | 3 | 320 | 0.42 | 0.55 | Good | 130 | 98 |
| 7 | m-cresol/p-cresol = 50/50 | 100 | II | 29 | B | 3 | 320 | 0.54 | 0.55 | Good | 130 | 97 |
| 8 | m-cresol/p-cresol/3,5-dimethylphenol = 50/50/20 | 100 | II | 29 | A | 3 | 310 | 0.51 | 0.50 | Good | 130 | 98 |
| 9 | m-cresol/p-cresol/3,5-dimethylphenol = 60/30/40 | 100 | II | 32 | B | 3 | 305 | 0.49 | 0.50 | Good | 130 | 98 |
| 10 | m-cresol/4-t-butylphenol = 80/20 | 100 | II | 26 | C | 3 | 294 | 0.56 | 0.55 | Good | 130 | 99 |
| 11 | m-cresol/3,5-dimethyl- | 100 | II | 26 | A | 3 | 295 | 0.60 | 0.50 | Good | 130 | 98 |

TABLE 1-continued

| Exp. | Novolak resin Charge composition of phenols (mol %) | Amount (parts by wt.) | 1,2-Quinone diazide compound 1) Kind | Amount (parts by wt.) | Specified aromatic compound 2) Kind | Amount (parts by wt.) | Ethyl cellosolve acetate Amount (parts by wt.) | Evaluation results Sensitivity | Resolution (μm) | Developing properties | Heat resistance (°C.) | Remained thickness ratio (%) |
|---|---|---|---|---|---|---|---|---|---|---|---|---|
| 12 | m-cresol/p-cresol/2,5-dimethylphenol = 30/30/40 | 100 | II | 32 | C | 3 | 308 | 0.41 | 0.50 | Good | 130 | 98 |
| 13 | m-cresol/3,5-dimethylphenol = 60/40 | 100 | III | 26 | A | 3 | 296 | 0.53 | 0.50 | Good | 130 | 98 |
| 14 | m-cresol/3,5-dimethylphenol = 50/50 | 100 | III | 26 | B | 3 | 280 | 0.40 | 0.50 | Good | 130 | 99 |
| 15 | m-cresol/2,3,5-trimethylphenol = 60/40 | 100 | II | 30 | C | 3 | 315 | 0.39 | 0.50 | Good | 130 | 98 |
| 16 | m-cresol/2,3,5-trimethylphenol = 60/40 | 100 | III | 26 | C | 3 | 319 | 0.44 | 0.50 | Good | 130 | 98 |
| 17 | m-cresol/2,3,5-trimethylphenol = 50/50 | 100 | II | 30 | B | 3 | 315 | 0.37 | 0.50 | Good | 130 | 99 |
| 18 | m-cresol/2,3,5-trimethylphenol = 50/50 | 100 | III | 26 | B | 3 | 319 | 0.40 | 0.50 | Good | 130 | 99 |
| 19 | m-cresol/3,5-dimethylphenol = 50/50 | 100 | II | 26 | D | 3 | 315 | 0.38 | 0.50 | Good | 125 | 99 |
| 20 | m-cresol/3,5-dimethylphenol = 50/50 | 100 | III | 26 | D | 3 | 319 | 0.41 | 0.50 | Good | 130 | 99 |

Notes

1) The kind of the 1,2-quinone diazide compound
I: condensation reaction product of 2.5 moles of 1,2-naphthoquinonediazide-5-sulfonic acid chloride and 1 mole of 2,3,4-trihydroxybenzophenone
II: condensation reaction product of 3.0 moles of 1,2-naphthoquinonediazide-5-sulfonic acid chloride and 1 mole of 2,3,4,4'-tetrahydroxybenzophenone
III: condensation reaction product of 3.5 moles of 1,2-naphthoquinonediazide-5-sulfonic acid chloride and 1 mole of 2,3,4,4'-tetrahydroxybenzophenone 2) The kind of the specific aromatic compound
A: 4-hydroxy-3,4'-dimethoxychalcone
B: 4-hydroxy-3',4',5'-trimethoxychalcone
C: 4-hydroxy-3',4'-dioxolenylchalcone
D: 2/1 (by weight) mixture of 4-hydroxy-3',4',5'-trimethoxychalcone and Yellow HM-1123 (a product by Mitsui Toatsu Dyes, Ltd.)

We claim:

1. An i-line of ultraviolet radiation sensitive resin composition comprising an admixture of:
   (a) 100 parts by weight of an alkali-soluble resin;
   (b) 5 to 100 parts by weight of a 1,2-quinone diazide compound, which may have reacted with the alkali-soluble resin to form a condensate; and
   (c) 0.1 to 10 parts by weight of a compound which is at least one compound selected from the group consisting of 4-hydroxy-4'-methylchalcone, 4-hydroxy-3', 4'-dimethoxychalcone, 4-hydroxy-3',4',5'-trimethoxychalcone, 4-hydroxy-3',4'-dioxylenylchalcone and 4-hydroxy-3',4'-dimethylchalcone.

2. The composition according to claim 1, wherein the alkali-soluble resin is an alkali-soluble novolak resin.

3. The composition according to claim 1, wherein the 1,2-quinone diazide compound is at least one compound selected from the group consisting of 1,2-benzoquinonediazide-4-sulfonates, 1,2-naphtoquinonediazide-4-sulfonates and 1,2-naphthoquinonediazide-5-sulfonates.

4. The composition according to claim 1, wherein the compound (c) is used in amount of from 1 to 5 parts by weight of the alkali-soluble resin.

* * * * *